(12) United States Patent
Nazarian et al.

(10) Patent No.: US 6,788,042 B2
(45) Date of Patent: Sep. 7, 2004

(54) VARIABLE IMPEDANCE NETWORK FOR AN INTEGRATED CIRCUIT POTENTIOMETER

(75) Inventors: Hagop A. Nazarian, San Jose, CA (US); William Tang, Orinda, CA (US); Zhan Duan, San Jose, CA (US); Chao-Ming Tsai, San Jose, CA (US); Lawrence D. Engh, Redwood City, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/102,117

(22) Filed: Mar. 20, 2002

(65) Prior Publication Data

US 2003/0111992 A1 Jun. 19, 2003

Related U.S. Application Data

(63) Continuation-in-part of application No. 09/989,874, filed on Nov. 20, 2001, now Pat. No. 6,552,519.

(51) Int. Cl.$^7$ .................................................. H02J 3/12
(52) U.S. Cl. ...................... 323/354; 323/297; 323/298; 341/145; 341/153
(58) Field of Search ................................. 323/293, 297, 323/298, 352, 353, 354; 341/144, 145, 146, 153, 156, 154

(56) References Cited

U.S. PATENT DOCUMENTS

| | | | |
|---|---|---|---|
| 4,468,607 A | | 8/1984 | Tanaka et al. |
| 5,084,667 A | | 1/1992 | Drori et al. |
| 6,201,491 B1 | * | 3/2001 | Brunolli et al. ............. 341/144 |
| 6,331,768 B1 | * | 12/2001 | Drori et al. ................. 323/369 |

* cited by examiner

*Primary Examiner*—Michael Sherry
*Assistant Examiner*—Gary L. Laxton
(74) *Attorney, Agent, or Firm*—Blakely, Sokoloff, Taylor & Zafman LLP

(57) ABSTRACT

An impedance network, which includes at least one end terminal, a wiper terminal, a center impedance element, and a first plurality of impedance elements. The wiper terminal provides a tap position at a selected impedance value of the impedance network, selectable at a specified increment value. The first plurality of impedance elements is configured to reduce resistance variation during switching from one tap position to another tap position. The first plurality of impedance elements is connected in series in a mirrored configuration about the center impedance element.

19 Claims, 7 Drawing Sheets

VARIABLE IMPEDANCE NETWORK FOR AN INTEGRATED CIRCUIT POTENTIOMETER

CROSS REFERENCE TO RELATED APPLICATIONS

This application is a continuation-in-part of U.S. patent application Ser. No. 09/989,874, filed Nov. 20, 2001 now U.S. Pat. No. 6,552,519 and entitled "Variable Impedance Network for an Integrated Circuit" and commonly assigned to the assignee of the present invention.

BACKGROUND

The present invention relates to variable impedance networks. More particularly, the invention relates to such variable impedance networks for an integrated circuit potentiometer.

Variable impedance networks are usually manually adjusted to provide a selected impedance so as to affect some aspect of the circuit in which the networks are located. These variable impedance networks are usually in the form of variable resistors, also called potentiometers. However, circuits using variable inductors or capacitors may also be formed.

Manual adjustment of potentiometers is usually undesirable in circuits under the control of data processing systems or other external electric circuits where ongoing adjustment of the potentiometer is necessary for circuit operation. The data processing system often must change the value of the variable impedance network in a time that is short relative to the time required to complete a manual adjustment of the variable impedance element. Therefore, special purpose integrated circuit variable impedance networks have been employed in the prior art. These networks allow the level of attenuation to be adjusted under the digital control of an external data processing system.

For example, Tanaka, et al., U.S. Pat. No. 4,468,607, teaches a ladder attenuator which is controlled by a binary number by means of a switch circuit. Depending on the stage of the switches in this switch circuit, one or more stages of attenuation are introduced into the signal path. However, teachings of Tanaka may require a large number of fixed impedance elements and switches for a large range of impedances. Accordingly, Drori, et al., U.S. Pat. No. 5,084,667, suggests a number of embodiments of variable impedance elements which minimizes the number of separate resistors required to achieve the equivalent resolution achievable using a series arrangement of resistors.

SUMMARY

The present invention, in one aspect, describes an impedance network, which includes at least one end terminal, a wiper terminal, a center impedance element, and a first plurality of impedance elements. The wiper terminal provides a tap position at a selected impedance value of the impedance network, selectable at a specified increment value. The first plurality of impedance elements is configured to reduce resistance variation during switching from one tap position to another tap position. The first plurality of impedance elements is connected in series in a mirrored configuration about the center impedance element.

In another aspect, the present invention describes a method for configuring an impedance network. The method includes first configuring a first plurality of resistors selectively connectable in parallel, and connecting a second plurality of resistive elements in series, where each resistive element includes equivalent resistance formed by the first plurality of resistors. A center resistor is provided, and the second plurality of resistive elements is configured into a mirrored configuration with respect to the center resistor. Nodes of the second plurality of resistive elements are then selectively connected to a wiper terminal of the impedance network.

DETAILED DESCRIPTION

In recognition of the above-stated challenges associated with prior art designs of variable impedance networks, alternative embodiments for a variable impedance network which reduces overhead circuits including wiper transistors are described. Consequently, for purposes of illustration and not for purposes of limitation, the exemplary embodiments of the invention are described in a manner consistent with such use, though clearly the invention is not so limited.

Figure 1A:
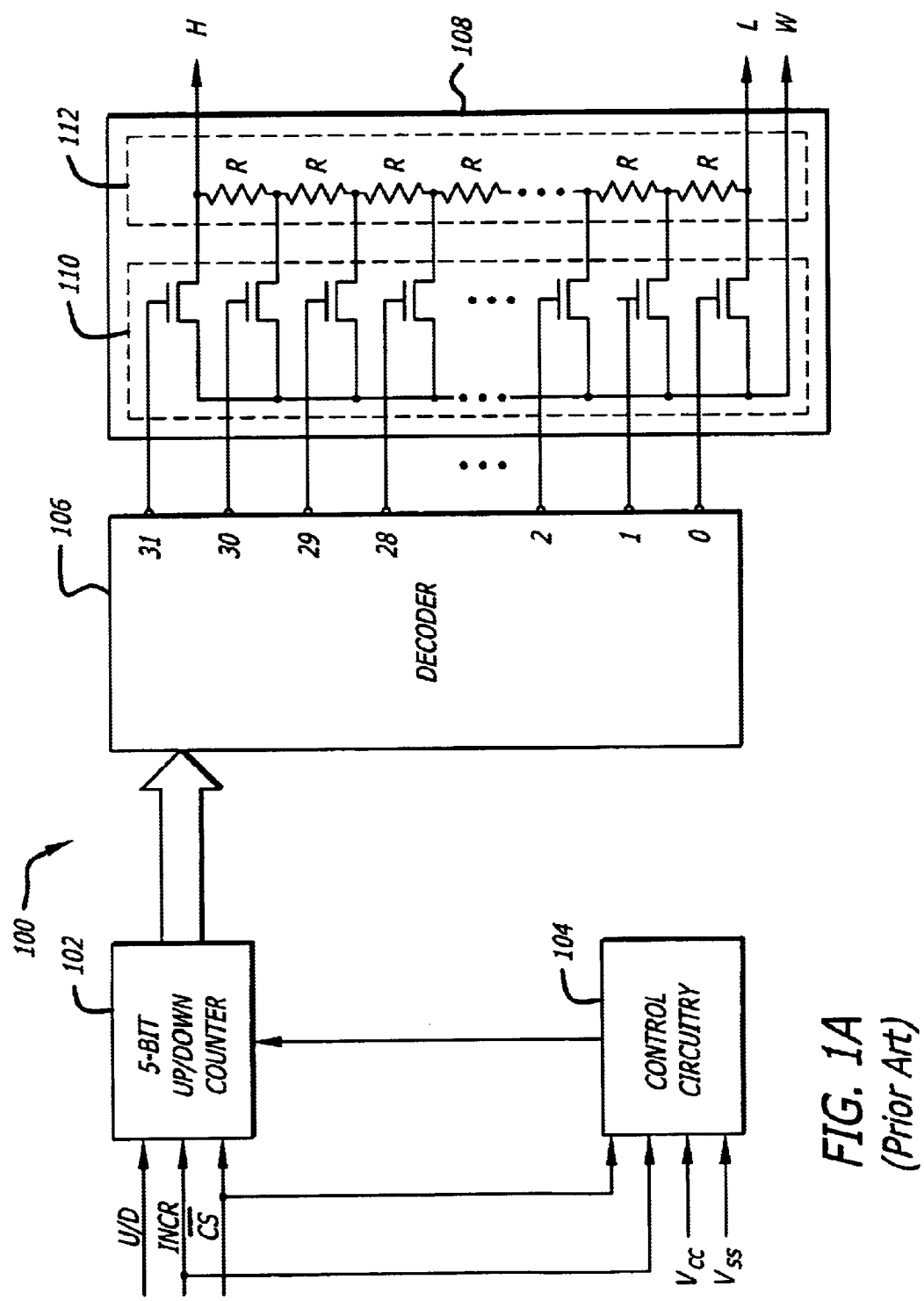
FIG. 1A shows a conventional variable resistance network.

A conventional variable resistance network 100 is illustrated in FIG. 1A. The network 100 includes a counter 102, a control circuitry 104, a decoder 106, and a network array 108 having a transistor array 110 and a resistor array 112. In the illustrated example, the network array 108 has three terminals, H, L and W. Hence, the network array 108 simulates a standard potentiometer 120, such as the one shown in FIG. 1B. Terminals H and L correspond to the end terminals, while terminal W corresponds to the center tap of the potentiometer 120.

In the illustrated example of FIG. 1A, the resistor array 112 includes 32 equal resistor elements (R) arranged in series to represent 32 tap positions at the wiper nodes of the potentiometer 120. However, any number of resistor elements may be used to provide smaller or larger resistance value than this example. The transistor array 110 includes wiper transistors that are used to connect various combinations of resistor elements between two terminals H and W. The particular combination is determined by a value stored in a counter 102, which may be altered by two signals, U/D and INCR. The U/D signal determines whether the counter 102 will be incremented or decremented by a predetermined amount in response to the increment (INCR) signal. This value is coupled to a 1-of-N decoder 106, where N=32. The output of this decoder 106 controls the plurality of wiper transistors in the transistor array 110. Since N is the maximum value which may be stored in the counter 102, there are N nodes in the resistor array 112, each node corresponding to a given counter value. Each node may be coupled to terminal W by applying a signal to the corresponding wiper transistor in the transistor array 110.

The value stored in the counter 102 may be transferred to a memory in the control circuitry 104 in response to specified voltage transitions on a chip select (CS) line. The chip select line also enables the counter 102. When the chip select line is low, the counter 102 responds to signals on U/D and INCR lines. This enables the circuit controlling the variable resistance network 100 to alter the value stored in counter 102.

The control circuitry 104 also monitors supply voltages ($V_{CC}$ and $V_{SS}$) to load the value stored in the memory into the counter 102 when power is applied to the variable resistance network 100. This ensures that the last value stored in counter 102 before power was removed from the variable resistance network 100 will be restored when the power is once again applied to the variable resistance network 100.

Figure 1B:
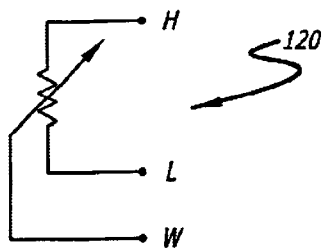
FIG. 1B shows a standard center-tapped potentiometer.

With the above-described approach illustrated in FIGS. 1A and 1B, N wiper transistors are required to generate N tap positions. Hence, when N becomes large (e.g., N>100), the area of the die occupied by the wiper transistors may significantly increase, especially when the specification for wiper resistance is low (i.e., 50 ohms or less).

Accordingly, the present embodiments include solutions to the above-stated undesirable outcome of large N by providing a variable impedance network which requires fewer wiper transistors. Moreover, the teachings of these embodiments may be extended to include impedance networks having elements other than resistors, such as capacitors or inductors. In the below-described embodiments, the impedance network is a binary numbering scheme assigned to a plurality of serially connected resistive pairs, where each pair is connected in parallel. However, in an alternative embodiment, more than two resistors may be configured in parallel arrangement to provide wider range of resistance values, and thus, further reduce the wiper transistor count. In a further embodiment, bypass transistors may be provided to bypass certain resistors. This may also provide wider range resistance values.

Figure 2:
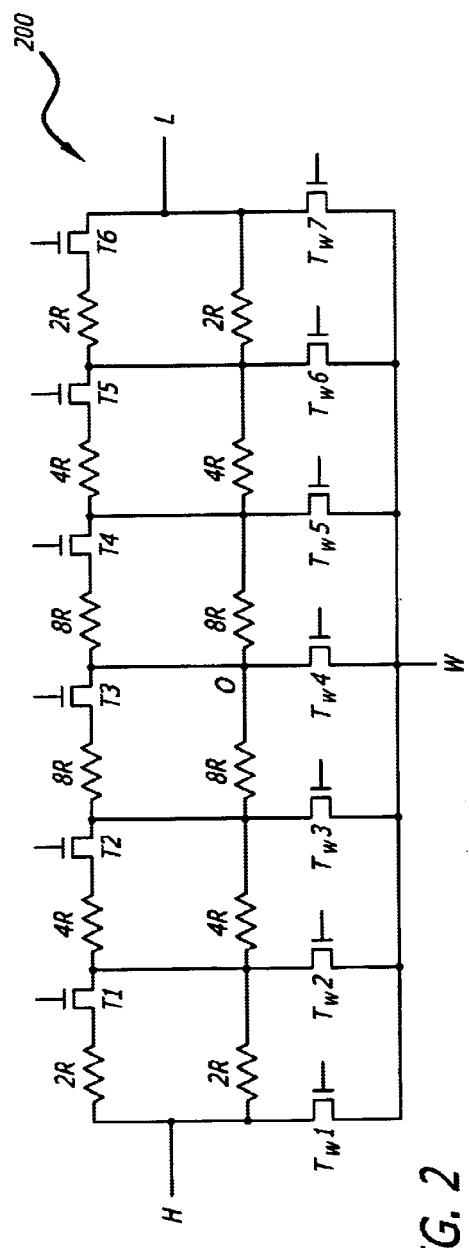
FIG. 2 illustrates an impedance network array configuration.

An impedance network array configuration 200 is illustrated in FIG. 2, in which the network array 200 is configured into a plurality of serially connected resistor pairs, where each pair is connected in parallel. Furthermore, the plurality of serially connected resistor pairs is connected with connection nodes. Resistance values of the resistor pair connected in parallel are equal. A switching element, such as a transistor, may be connected in series with one resistor of the resistive pair to either provide that resistor in parallel or to disconnect that resistor. In particular, the transistor may be a field-effect transistor (FET). Resistance values of the plurality of serially connected resistor pairs may be different. In this example, the resistance values of the plurality of serially connected resistor pairs are mirrored with respect to the center node, O. However, the mirrored configuration is not required. Furthermore, each resistor pair is selectively connected to the wiper terminal (W) through a switching element such as a transistor to select different combinations of series resistances. In particular, the transistor may be a field-effect transistor (FET).

Further, the impedance network array configuration 200 is arranged to meet two constraints. The first constraint is to keep the end-to-end resistance of the array (i.e., potentiometer) 200 constant. This constraint for constant end-to-end resistance between the end terminals H and L must be followed to ensure proper functioning of the potentiometer. The second constraint is to generate all possible taps at the variable node of the potentiometer, with each tap providing a unit resistance (R). Therefore, a 21 R end-to-end resistance potentiometer with 22 1 R taps may be configured as shown in FIG. 2.

To accomplish the first constraint, the binary sequence is mirrored around the center node O so that any resistance between H and W is complemented with a resistance between W and L that keeps the end-to-end resistance constant to 21 R. For example, if 1 R (i.e., 2 R||2 R, where || indicates parallel configuration) is selected on the H-to-W side by turning on transistors T1 and $T_w2$, a 20 R resistance must be selected with the rest of the resistor array on the W-to-L side by turning on T2 and T3. This generates a 20 R configured by (4 R||4 R)+(8 R||8 R)+8 R+4 R+2 R=2 R+4 R+8 R+4 R+2 R. In the illustrated embodiment, transistors labeled TX, where X is between 1 and 6, are referred to as pass transistors. Transistors labeled as $T_wX$, where X is between 1 and 7, are referred to as wiper transistors. Thus, the pass transistor allows resistors into parallel configuration, while the wiper transistor allows incorporation of each series resistance to be applied.

The second constraint to achieve all minimum increment (R) taps may be ensured by determining the end-to-end resistance using the following formula:

$$R_{end-to-end} = R_{max} + R_{min},$$

where $R_{max}$ is the maximum resistance that may be configured up to the center (labeled as O in FIG. 2) of the network array 200 (i.e., configured with one-half of the network array); and $R_{min}$ is the minimum resistance that may be configured up to the center (labeled as O in FIG. 2) of the network array 200.

In FIG. 2, $R_{max}$ is 14 R and $R_{min}$ is 7 R. Hence, in this configuration, $R_{min}=R_{max}/2$. Furthermore, $R_{end-to-end}=14$ R+7 R=21 R. This end-to-end resistance satisfies the two constraints and generates all the possible 22 taps for the 21 R potentiometer 200. Accordingly, 1 R is achieved, for example, on the H-to-W side by turning on transistors T1 and $T_w2$. This requires 20 R on the rest of the network array on the W-to-L side by turning on transistors T2 and T3. 2 R is achieved on the H-to-W side by turning on transistor $T_w2$. This requires 19 R on the rest of the network array on the W-to-L side by turning on transistors T2, T3, and T6. Furthermore, 3 R is achieved on the H-to-W side by turning on transistors T1, T2, and $T_w3$. This requires 18 R on the rest of the network array on the W-to-L side by turning on T3. Similar arrangements may be configured to provide the rest of the resistance values from 4 R to 21 R, at an increment of 1 R.

Figure 3:
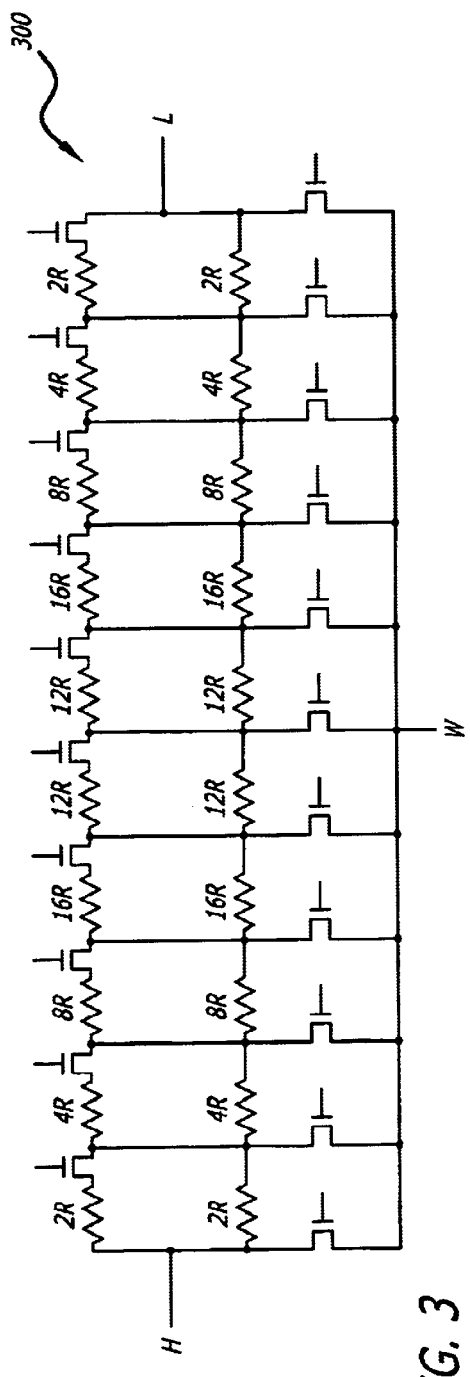
FIG. 3 illustrates a resistor network configuration for 64-tap potentiometer.

Table 1 shows resistor network configurations for 64, 128, and 256 tap potentiometer configurations, and their resistance construction values and sequence. Although the table shows only three configurations, further configurations with any number of steps may be arranged similarly. As an example, FIG. 3 illustrates a resistor network configuration 300 for 64-tap potentiometer.

TABLE 1

| Total Step | $R_{TOTAL}$ | $R_{MIN}$ | $R_{MAX}$ | Network Configuration |
|---|---|---|---|---|
| 64 | 63R | 21R | 42R | 2R, 4R, 8R, 16R, 12R, 12R, 16R, 8R, 4R, 2R |
| 128 | 127R | 41R | 86R | 2R, 4R, 8R, 16R, 32R, 24R, 24R, 32R, 16R, 8R, 4R, 2R |
| 256 | 255R | 85R | 170R | 2R, 4R, 8R, 16R, 32R, 64R, 44R, 44R, 64R, 32R, 16R, 8R, 4R, 2R |

Figure 4:
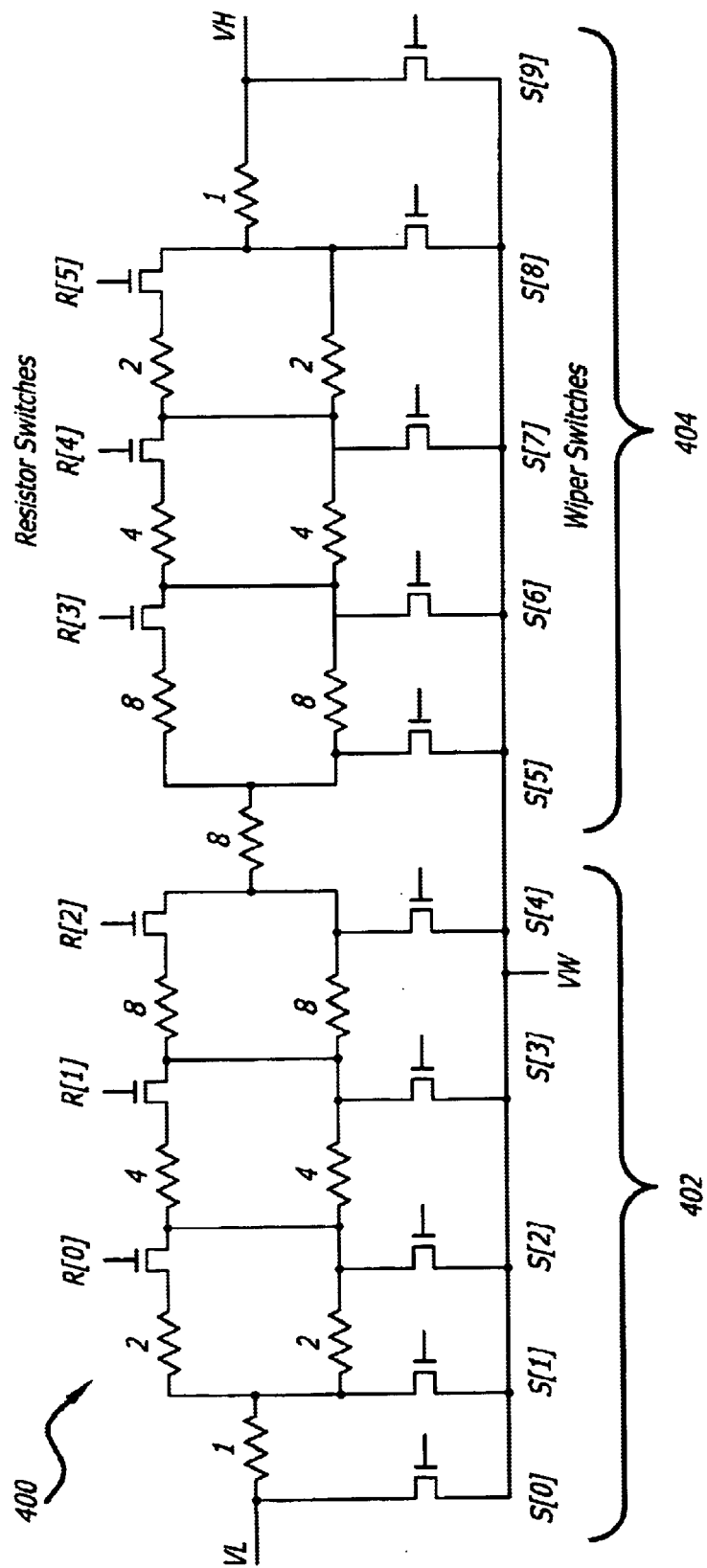
FIG. 4 illustrates a three terminal potentiometer implemented with a variable resistive network in accordance with an embodiment of the invention.

FIG. 4 illustrates a three terminal potentiometer implemented with a variable resistive network 400 in accordance with an embodiment of the invention. However, the network 400 may be implemented with any impedance elements. The network 400 has been configured to overcome some of the difficulties presented in the networks 200, 300 of FIGS. 2 and 3, and tabulated in Table 1.

In the illustrated embodiment, the network 400 is configured with resistor elements connected in parallel and in series depending on the controls to the switches. Furthermore, these resistor element values are chosen such that it compliments a binary numbering scheme. Hence, the improved binary-based resistor network 400 was designed with two goals in mind: to create an easily expandable resistor network pattern that allows for equal step increments of 32, 64, 128, 256, etc; and has simple decoding scheme.

The illustrated resistor network 400 includes a pair of 1 R resistors before parallel combinations of 2 R, 4 R, 8 R, etc., at the two end terminals. The network also includes a single resistor element in the middle of the network. This resistor element is chosen based on the number of resistor steps desired. Moreover, the network 400 is designed in such a way that the second half 404 of the network 400 is a mirrored version of the first half 402 (i.e., 1 R–2 R–4 R–8 R in the first half and 8 R–4 R–2 R–1 R in the second half). Hence, the total resistance of this network 400 is 1 R+2 R+4 R+8 R+8 R+(8 R+4 R+2 R)/2+1 R=31 R, which creates 32 resistor steps. This mirrored configuration may be extended to any number of binary configurations.

Further, the mirrored configurations of the network 400 enables the controls of the pass gate switches, R[x], to be created by the inverse of the input bits (for the first half 402 of the network 400), and the input bits themselves (for the second half 404 of the network 400). Because the resistor controls to the two halves 402, 404 of the network 400 are mutually exclusive, the network 400 almost always sees a combination of one resistance (2 R+4 R+8 R) and a parallel combination of that resistance (2 R/2+4 R/2+8 R/2). This keeps the total end-to-end resistance constant, regardless of which combinations of series and parallel resistors were used in the first half 402 of the network 400.

The controls for the first half 402 of the wiper switches, S[x], are determined by the first 1 in the most significant position of the digital input. Controls for the second half 404 of the wiper switches, S[x], are determined by the first 0 in the most significant position of the digital input. Table 2 illustrates the implementation of the controls for the pass gate and wiper switches.

The illustrated network 400 has been described in terms of configuration used for digital inputs of 5 bits to create 32 1 R resistance steps. However, the advantage is that the network 400 is readily applicable to a digital input of any bit length, so long as the necessary resistor components are added or subtracted. For example, if a digital input of 8 bits is to be used, the network may be expanded to 1 R(s), 2 R, 4 R, 8 R, 16 R, 32 R, 64 R, 64 R(s), 64 R, 32 R, 16 R, 8 R, 4 R, 2 R, 1 R(s), where (s) indicates a single resistor. Hence, this configuration follows the same pattern as the 32-step network. Table 3 illustrates circuit implementations of different number of resistor taps. Wiper and resistor switching controls for the new stages also follow the same patterns as before but expanded to accommodate for 8 input bits. No extra decoding logic needs to be developed and no patterns need to be established.

TABLE 2

Wiper and Pass Gate controls for the improved binary-based network

| | | WIPER CONTOLS | | | | | | | | | | | PASS GATE CONTOLS | | | | | |
|---|---|---|---|---|---|---|---|---|---|---|---|---|---|---|---|---|---|---|
| Decimal | Binary | S0 | S1 | S2 | S3 | S4 | S5 | S6 | S7 | S8 | S9 | Binary | R0 | R1 | R2 | R3 | R4 | R5 |
| 0 | 00000 | 1 | 0 | 0 | 0 | 0 | 0 | 0 | 0 | 0 | 0 | 00000 | 0 | 0 | 0 | 1 | 1 | 1 |
| 1 | 00001 | 0 | 1 | 0 | 0 | 0 | 0 | 0 | 0 | 0 | 0 | 00001 | 1 | 0 | 0 | 1 | 1 | 0 |
| 2 | 00010 | 0 | 0 | 1 | 0 | 0 | 0 | 0 | 0 | 0 | 0 | 00010 | 0 | 1 | 0 | 1 | 0 | 1 |
| 3 | 00011 | 0 | 0 | 1 | 0 | 0 | 0 | 0 | 0 | 0 | 0 | 00011 | 1 | 1 | 0 | 1 | 0 | 0 |
| 4 | 00100 | 0 | 0 | 0 | 1 | 0 | 0 | 0 | 0 | 0 | 0 | 00100 | 0 | 0 | 1 | 0 | 1 | 1 |
| 5 | 00101 | 0 | 0 | 0 | 1 | 0 | 0 | 0 | 0 | 0 | 0 | 00101 | 1 | 0 | 1 | 0 | 1 | 0 |
| 6 | 00110 | 0 | 0 | 0 | 1 | 0 | 0 | 0 | 0 | 0 | 0 | 00110 | 0 | 1 | 1 | 0 | 0 | 1 |
| 7 | 00111 | 0 | 0 | 0 | 1 | 0 | 0 | 0 | 0 | 0 | 0 | 00111 | 1 | 1 | 1 | 0 | 0 | 0 |
| 8 | 01000 | 0 | 0 | 0 | 0 | 1 | 0 | 0 | 0 | 0 | 0 | 01000 | 0 | 0 | 0 | 1 | 1 | 1 |
| 9 | 01001 | 0 | 0 | 0 | 0 | 1 | 0 | 0 | 0 | 0 | 0 | 01001 | 1 | 0 | 0 | 1 | 1 | 0 |
| 10 | 01010 | 0 | 0 | 0 | 0 | 1 | 0 | 0 | 0 | 0 | 0 | 01010 | 0 | 1 | 0 | 1 | 0 | 1 |
| 11 | 01011 | 0 | 0 | 0 | 0 | 1 | 0 | 0 | 0 | 0 | 0 | 01011 | 1 | 1 | 0 | 1 | 0 | 0 |
| 12 | 01100 | 0 | 0 | 0 | 0 | 1 | 0 | 0 | 0 | 0 | 0 | 01100 | 0 | 0 | 1 | 0 | 1 | 1 |
| 13 | 01101 | 0 | 0 | 0 | 0 | 1 | 0 | 0 | 0 | 0 | 0 | 01101 | 1 | 0 | 1 | 0 | 1 | 0 |
| 14 | 01110 | 0 | 0 | 0 | 0 | 1 | 0 | 0 | 0 | 0 | 0 | 01110 | 0 | 1 | 1 | 0 | 0 | 1 |
| 15 | 01111 | 0 | 0 | 0 | 0 | 1 | 0 | 0 | 0 | 0 | 0 | 01111 | 1 | 1 | 1 | 0 | 0 | 0 |
| 16 | 10000 | 0 | 0 | 0 | 0 | 0 | 1 | 0 | 0 | 0 | 0 | 10000 | 0 | 0 | 0 | 1 | 1 | 1 |
| 17 | 10001 | 0 | 0 | 0 | 0 | 0 | 1 | 0 | 0 | 0 | 0 | 10001 | 1 | 0 | 0 | 1 | 1 | 0 |
| 18 | 10010 | 0 | 0 | 0 | 0 | 0 | 1 | 0 | 0 | 0 | 0 | 10010 | 0 | 1 | 0 | 1 | 0 | 1 |
| 19 | 10011 | 0 | 0 | 0 | 0 | 0 | 1 | 0 | 0 | 0 | 0 | 10011 | 1 | 1 | 0 | 1 | 0 | 0 |
| 20 | 10100 | 0 | 0 | 0 | 0 | 0 | 1 | 0 | 0 | 0 | 0 | 10100 | 0 | 0 | 1 | 0 | 1 | 1 |
| 21 | 10101 | 0 | 0 | 0 | 0 | 0 | 1 | 0 | 0 | 0 | 0 | 10101 | 1 | 0 | 1 | 0 | 1 | 0 |
| 22 | 10110 | 0 | 0 | 0 | 0 | 0 | 1 | 0 | 0 | 0 | 0 | 10110 | 0 | 1 | 1 | 0 | 0 | 1 |
| 23 | 10111 | 0 | 0 | 0 | 0 | 0 | 1 | 0 | 0 | 0 | 0 | 10111 | 1 | 1 | 1 | 0 | 0 | 0 |

TABLE 2-continued

Wiper and Pass Gate controls for the improved binary-based network

| 24 | 11000 | 0 | 0 | 0 | 0 | 0 | 0 | 1 | 0 | 0 | 0 | 11000 | 0 | 0 | 0 | 1 | 1 | 1 |
| 25 | 11001 | 0 | 0 | 0 | 0 | 0 | 0 | 1 | 0 | 0 | 0 | 11001 | 1 | 0 | 0 | 1 | 1 | 0 |
| 26 | 11010 | 0 | 0 | 0 | 0 | 0 | 0 | 1 | 0 | 0 | 0 | 11010 | 0 | 1 | 0 | 1 | 0 | 1 |
| 27 | 11011 | 0 | 0 | 0 | 0 | 0 | 0 | 1 | 0 | 0 | 0 | 11011 | 1 | 1 | 0 | 1 | 0 | 0 |
| 28 | 11100 | 0 | 0 | 0 | 0 | 0 | 0 | 0 | 1 | 0 | 0 | 11100 | 0 | 0 | 1 | 0 | 1 | 1 |
| 29 | 11101 | 0 | 0 | 0 | 0 | 0 | 0 | 0 | 1 | 0 | 0 | 11101 | 1 | 0 | 1 | 0 | 1 | 0 |
| 30 | 11110 | 0 | 0 | 0 | 0 | 0 | 0 | 0 | 0 | 1 | 0 | 11110 | 0 | 1 | 1 | 0 | 0 | 1 |
| 31 | 11111 | 0 | 0 | 0 | 0 | 0 | 0 | 0 | 0 | 0 | 1 | 11111 | 1 | 1 | 1 | 0 | 0 | 0 |

TABLE 3

Resistor network implementations for various number of tap positions

| Resistor Taps | Resistor Network Design All elements represent a pair or resistors, one with a pass gate, one without |
| --- | --- |
| 32 | 1R(s), 2R, 4R, 8R, 8R(s), 8R, 4R, 2R, 1R(s) |
| 64 | 1R(s), 2R, 4R, 8R, 16R, 16R(s), 16R, 8R, 4R, 2R, 1R(s) |
| 128 | 1R(s), 2R, 4R, 8R, 16R, 32R, 32R(s), 32R, 16R, 8R, 4R, 2R, 1R(s) |
| 256 | 1R(s), 2R, 4R, 8R, 16R, 32R, 64R, 64R(s), 64R, 32R, 16R, 8R, 4R, 2R, 1R(s) |
| 512 | 1R(s), 2R, 4R, 8R, 16R, 32R, 64R, 128R, 128R(s), 128R, 64R, 32R, 16R, 8R, 4R, 2R, 1R(s) |
| 1024 | 1R(s), 2R, 4R, 8R, 16R, 32R, 64R, 128R, 256R, 256R(s), 256R, 128R, 64R, 32R, 16R, 8R, 4R, 2R, 1R(s) | note:
(s) designates only single resistor

Figure 5:
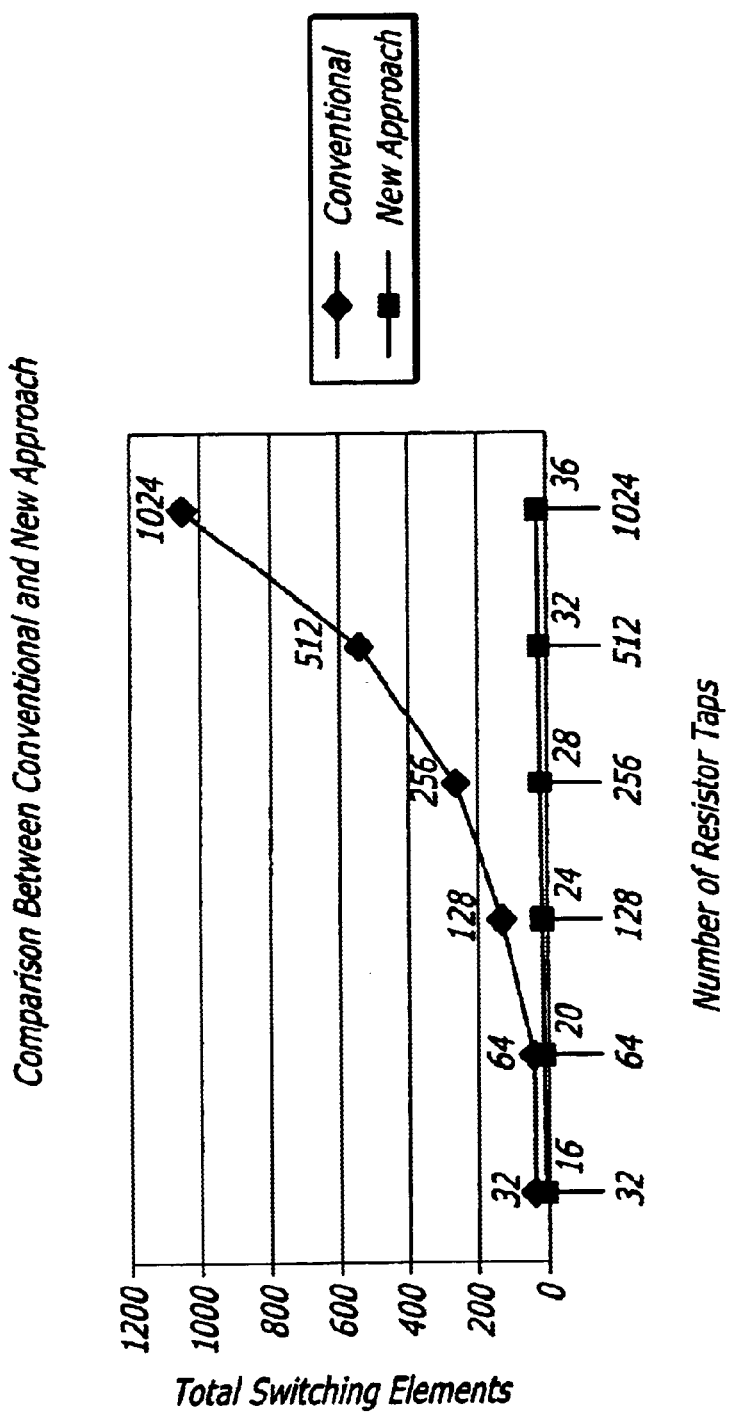
FIG. 5 is a graph comparing wiper/pass transistors used by the conventional approach to the improved approach.

The improved binary-based network 400 still maintains the advantages of the original binary-based network 200, 300, including the reduced parasitic capacitance and fewer number of wiper transfer switches. However, the improved network 400 provides further advantage by having fewer total unit resistors and total pass gates. Table 4 shows the difference between the resources used by the conventional approach 100, the original binary-based network approach 200, 300, and the improved binary-based approach 400. FIG. 5 is a graph comparing wiper/pass transistors used by the conventional approach to the improved approach.

TABLE 4

| Resistor Taps | resistor elements | | | total unit resistors | | | wiper elements | | | total switching elements | | |
| --- | --- | --- | --- | --- | --- | --- | --- | --- | --- | --- | --- | --- |
| | C | | I | C | | I | C | | I | C | | I |
| 32 | 31 | | 15 | 31 | | 66 | 32 | | 10 | 32 | | 16 |
| 64 | 63 | | 19 | 63 | | 138 | 64 | | 12 | 64 | | 20 |
| 128 | 127 | | 23 | 127 | | 282 | 128 | | 14 | 128 | | 24 |
| 256 | 255 | | 27 | 255 | | 570 | 256 | | 16 | 256 | | 28 |
| 512 | 511 | | 31 | 511 | | 1146 | 512 | | 18 | 512 | | 32 |
| 1024 | 1023 | | 35 | 1023 | | 2298 | 1024 | | 20 | 1024 | | 36 |

Element counts in the Conventional (C), Original Binary-based (O), and Improved Binary Based (I) approach During switching from one tap to the other tap, the wiper transistors switch on and off based on the tap selection address. During the wiper transistor switching (one turning on and the other turning off), an overlap time is intentionally introduced to keep the output impedance of the wiper stable. Therefore, one difficulty faced by the improved binary-based approach is that both wiper devices are turned on momentarily. This essentially creates a short through part of the resistor network and the end-to-end total resistance of the network is effectively reduced by the amount the wiper switches shorted out. In the original binary-based network and the improved binary-based network, the maximum resistance reduction occurs across the 64 R elements for a 256 tap resistive network. This creates a 25% reduction in end-to-end resistance. However, such a high operational variation in end-to-end resistance is undesirable for a system where the end-to-end resistance transiently changes during the tap position change.

TABLE 5

Serial/Binary (SB) based approach 256 tap design

1R(s), 2R, 4R, 8R, 16R, 32R, 64R, 64R(s), 64R, 32R, 16R, 8R, 4R, 2R, 1R(s)
1R(s), 2R, 4R, 8R, 16R, 16, 16, 16, 16, 16, 16, 16, 16, 16, 16, 16, 16, 16R, 8R, 4R, 2R, 1R(s)

In a new network approach, referred to as a serial/binary-based approach, instead of having the middle 32 R, 64 R, 64 R(s), 64 R, 32 R stages, the middle stage is replaced with an equivalent string of thirteen 16 R resistors. Total end-to-end resistance still remains at 255 R. Table 5 shows the new configuration of the network. In this embodiment, since the largest element in the network is 16 R, shorting out that largest element results in roughly a 6% decrease in resistance, which a much more acceptable variation. This concept may be extended to any number of tap designs.

Figure 6:
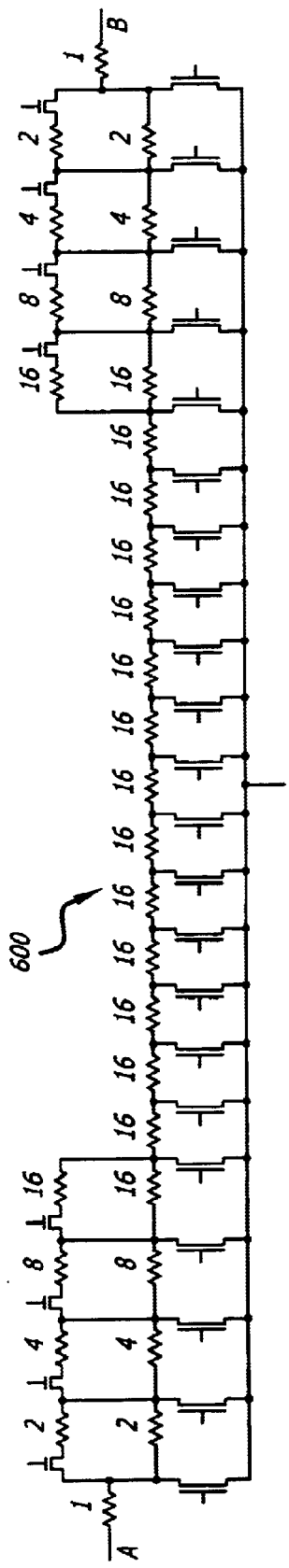
FIG. 6 shows a schematic representation of the 256-tap serial/binary-based network in accordance with an embodiment of the invention.

FIG. 6 shows a schematic representation of the 256-tap serial/binary-based network 600 in accordance with an embodiment of the invention. This network 600 minimizes the transient end-to-end resistance change during the tap position switching condition. Furthermore, the amount of the change is proportional to the value of the largest resistor elements between wiper transistors. Hence, this approach 600 shares the advantages of the original binary, and improved binary approaches, but also reduces the resistor switches/pass devices to improve the end-to-end resistance variation. Although the serial/binary approach 600 requires additional wiper transistors compared to the strictly binary approach, this serial/binary approach 600 requires less wiper transistors than the conventional approach. For example, by replacing the middle stages with a series of 16 R resistors, the new network 600 requires 8 extra wiper switches. On the plus side, the new network 600 requires 4 less pass gate switches. Therefore the total difference is only 4 extra switch elements.

The network 600 uses pass gates switches to connect the binary resistors. These pass gate switches have a parasitic resistance that introduces an error into the wiper node, and into the end-to-end resistance. This error may have adverse impact on the performance parameters of the potentiometer such as Integral non-linearity (INL), and differential non-linearity (DNL). Hence, to minimize this error, a trimming network 700 may be implemented at the two ends of a resistance network, such as the network 600.

Figure 7A:
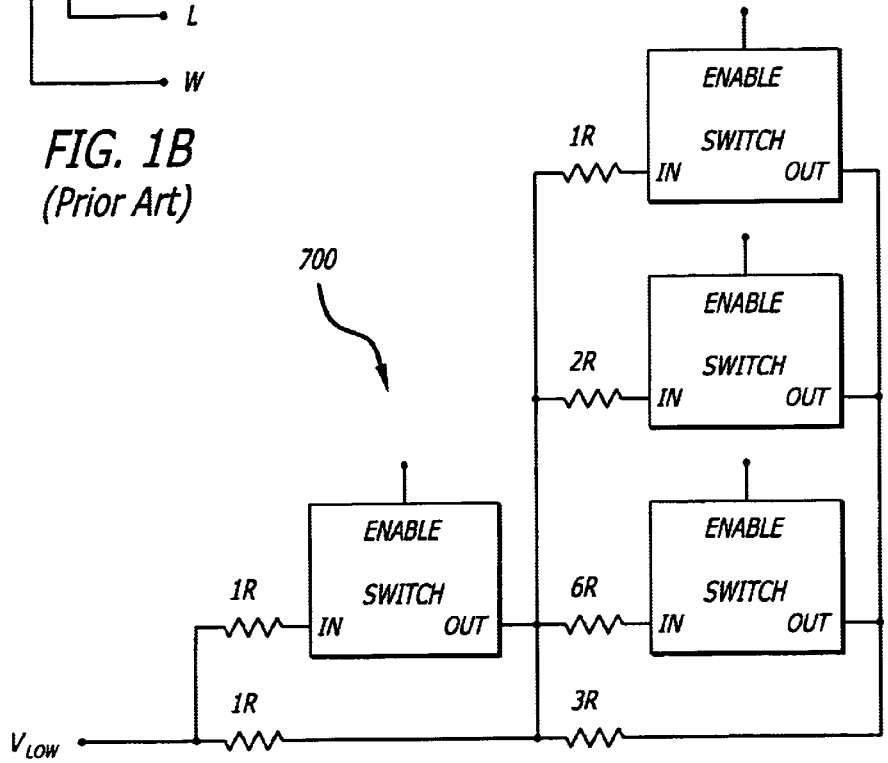
FIG. 7A shows one implementation of the trim option circuit.

FIG. 7A shows the implementation of the trim option circuit 700. The trimming network 700 generates resistance ranging from 0.5 to 4.0 R. By providing a nonvolatile memory that controls the pass gates, it is possible to trim the potentiometer for every stop and significantly improve the linearity of the resistance network. Table 6 shows the values of the trim circuit.

TABLE 6

| ideal | actual |
|---|---|
| 1 | 1.3607 |
| 1.25 | 1.7178 |
| 1.5 | 1.7679 |
| 1.75 | 2.125 |
| 2 | 2.194 |
| 2.2 | 2.4483 |
| 2.5 | 2.7245 |
| 3 | 3.0816 |
| 3.5 | 3.6429 |
| 4 | 4 |

Figure 7B:
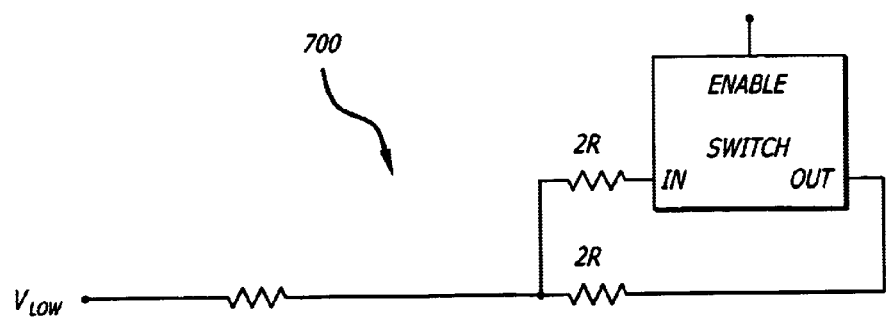
FIG. 7B shows one implementation of a resistive network without the trimming circuit.

The ideal column indicated the resistance values that may be obtained by ignoring any parasitic resistance from the pass gate switches. The actual column indicates the resistance values that may be obtained by assuming that a pass gate switch has a 0.8 R value. FIG. 7B shows the network 700 without the trimming circuit.

Figure 8A:
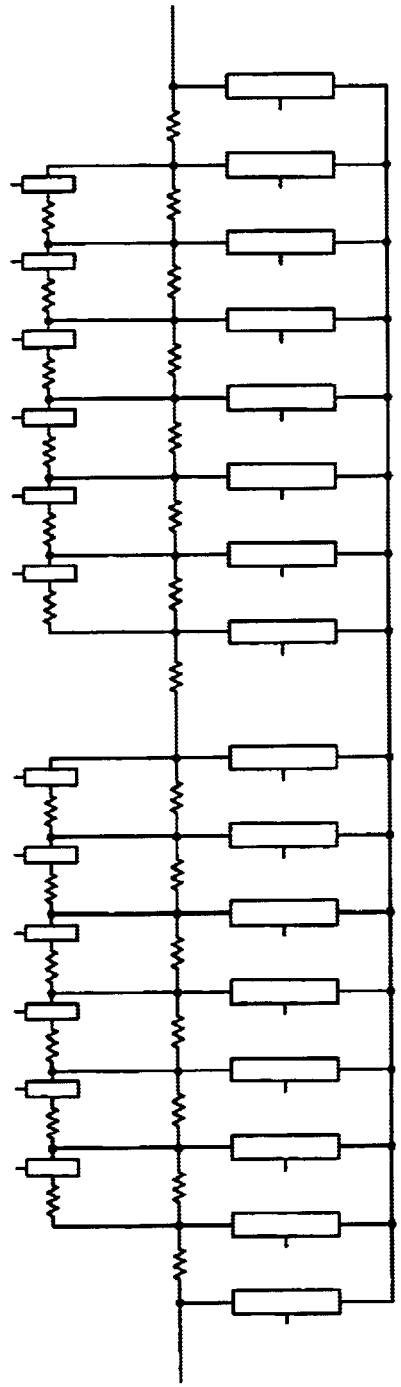
FIG. 8A shows the binary-based resistor network with a trimming circuit.
Figure 8B:
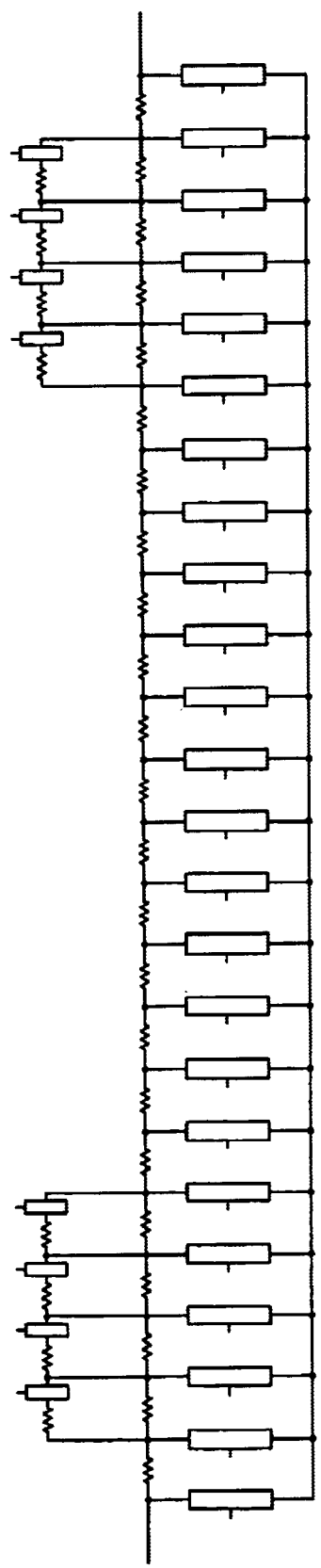
FIG. 8B shows a serial/binary-based resistor network with a trimming circuit.

FIGS. 8A and 8B show the binary-based resistor network with a trimming circuit, and the serial/binary-based resistor network with a trimming circuit, respectively.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. In other instances, well-known structures and functions were not described in elaborate detail in order to avoid obscuring the subject matter of the present invention. Accordingly, the scope and spirit of the invention should be judged in terms of the claims which follow.

What is claimed is:

1. An impedance network, comprising:

at least one end terminal;

a wiper terminal providing a tap position at a selected impedance value of the impedance network, selectable at a specified increment value, said wiper terminal selectable as an end terminal;

a center impedance element;

a first plurality of impedance elements configured to provide a range of impedance values with less number of wiper switching elements than for an impedance network with impedance elements having a uniformly selected increment value, the first plurality of impedance elements connected in series in a mirrored configuration about the center impedance element, wherein said first plurality of impedance elements includes a plurality of connection nodes which enables said first plurality of impedance elements to be connected in series, said first plurality of impedance elements includes a first plurality of wiper switching elements to selectively couple said plurality of connection nodes to the wiper terminal, said first plurality of wiper switching elements includes a plurality of transistors, and on/off states of said plurality of transistors are in a mirrored configuration around the center impedance element.

2. An impedance network, comprising:

at least one end terminal;

a wiper terminal providing a tap position at a selected impedance value of the impedance network, selectable at a specified increment value, said wiper terminal selectable as an end terminal;

a center impedance element;

and a first plurality of impedance elements configured to provide a range of impedance values with less number of wiper switching elements than for an impedance network with impedance elements having a uniformly selected increment value, the first plurality of impedance elements connected in series in a mirrored configuration about the center impedance element, wherein each impedance element of said first plurality of impedance elements includes a second plurality of impedance elements selectively connectable in parallel.

3. The network of claim 2, further comprising:

a second plurality of switching elements configured to selectively connect said second plurality of impedance elements in parallel.

4. The network of claim 3, wherein said second plurality of switching elements includes a plurality of transistors.

5. The network of claim 4, wherein said plurality of transistors includes a plurality of field-effect transistors (FET).

6. The network of claim 3, wherein said second plurality of impedance elements includes a pair of resistors of equal values, selectively connectable in parallel.

7. The network of claim 5, wherein said pair of resistors in different impedance elements of said first plurality of impedance elements are of unequal values.

8. The network of claim 7, wherein the value of the center impedance element is of equal value to the value of the pair of resistors in said second plurality of impedance elements on both sides of the center impedance element.

9. A resistance network having end terminals and a wiper terminal, comprising:

a first set of switching elements;

a first plurality of resistors selectively connectable in parallel with said first set of switching elements to form an equivalent resistive element where values of said first plurality of resistors are equal;

a center resistor;

a second plurality of resistors connected in series in a mirrored configuration about the center impedance element, each resistor of said second plurality of resistors including said equivalent resistive element, resistance values of different equivalent resistive elements in said second plurality of resistors is in a binary configuration with two middle equivalent resistive elements having an equal value with the value of the center resistor; and a second set of switching elements to couple nodes of said second plurality of resistors to the wiper terminal.

10. The network of claim 9, further comprising:

at least first and second end resistors coupled to the end terminals.

11. The network of claim 10, wherein the at least first and second end resistors are unit-valued resistors.

12. The network of claim 9, wherein said first set of switching elements includes a plurality of transistors.

13. The network of claim 12, wherein said plurality of transistors includes a plurality of field-effect transistors (FET).

14. A method for configuring an impedance network, comprising:

first configuring a first plurality of resistors selectively connectable in parallel;

connecting a second plurality of resistive elements in series, where each resistive element includes equivalent resistance formed by the first plurality of resistors;

providing a center resistor;

second configuring said second plurality of resistive elements into a mirrored configuration with respect to the center resistor; and selectively connecting nodes of said second plurality of resistive elements to a wiper terminal of the impedance network.

15. The method of claim 14, further comprising:

providing a pair of unit-sized resistors, one at each end of the second plurality of resistive elements.

16. The method of claim 14, wherein providing the center resistor includes configuring the value of the center resistor that is of equal value to the resistance of said second plurality of resistive elements on both sides of the center resistor.

17. The method of claim 14, further comprising:

selectively connecting said first plurality of resistors in parallel with a plurality of switching elements.

18. The method of claim 14, wherein said first configuring includes providing resistors of equal value.

19. The method of claim 14, wherein said second configuring includes providing resistors of different values to different resistive elements of the second plurality of resistive elements.

* * * * *